(12) United States Patent
Athas et al.

(10) Patent No.: US 7,626,425 B2
(45) Date of Patent: *Dec. 1, 2009

(54) HIGH PERFORMANCE CLOCK-POWERED LOGIC

(75) Inventors: William C. Athas, San Jose, CA (US); Nestor Tzartzanis, Belmont, CA (US); Weihua Mao, San Jose, CA (US); Lena Peterson, Gothenburg (SE)

(73) Assignee: University of Southern California, Los Angeles, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/332,852

(22) Filed: Jan. 13, 2006

(65) Prior Publication Data

US 2007/0018689 A1 Jan. 25, 2007

Related U.S. Application Data

(63) Continuation of application No. 10/031,672, filed as application No. PCT/US00/19608 on Jul. 18, 2000, now Pat. No. 7,005,893.

(60) Provisional application No. 60/144,520, filed on Jul. 19, 1999, provisional application No. 60/174,509, filed on Jan. 5, 2000.

(51) Int. Cl.
*H03K 19/00* (2006.01)
(52) U.S. Cl. ................................. 326/93; 326/21
(58) Field of Classification Search .................. 326/93, 326/95–96, 21
See application file for complete search history.

(56) References Cited

U.S. PATENT DOCUMENTS

| 4,200,810 A | 4/1980 | Cain et al. |
| 4,536,793 A | 8/1985 | Harshbarger et al. |
| 4,604,614 A | 8/1986 | Farr et al. |
| 5,001,731 A * | 3/1991 | Atwell et al. ............... 375/356 |
| 5,309,034 A | 5/1994 | Ishibashi |
| 5,436,821 A | 7/1995 | Inoue |
| 5,473,270 A | 12/1995 | Denker |
| 5,477,164 A | 12/1995 | Denker |

(Continued)

FOREIGN PATENT DOCUMENTS

GB 2248988 4/1992

(Continued)

OTHER PUBLICATIONS

International Search Report dated Sep. 14, 2000, mailed Oct. 10, 2000.

(Continued)

*Primary Examiner*—James Cho
(74) *Attorney, Agent, or Firm*—McDermott Will & Emery LLP

(57) ABSTRACT

High performance clock-powered logic runs at below supply levels and reduces the need for faster digital logic circuitry. In a preferred embodiment, a clocked buffer is used to drive the signal line. The receiving end of the line is connected to a jam latch, preferably followed by an n-latch, followed by the digital logic, and followed by a second n-latch. The first n-latch is eliminated in an alternate embodiment, preferably one that uses complementary data signals.

11 Claims, 5 Drawing Sheets

U.S. PATENT DOCUMENTS

| | | | |
|---|---|---|---|
| 5,504,441 A | 4/1996 | Sigal | |
| 5,506,520 A | 4/1996 | Frank et al. | |
| 5,517,145 A | 5/1996 | Frank | |
| 5,521,538 A * | 5/1996 | Dickinson | 326/93 |
| 5,559,463 A | 9/1996 | Denker et al. | |
| 5,583,457 A * | 12/1996 | Horiguchi et al. | 326/121 |
| 5,646,555 A | 7/1997 | Morinaka | |
| 5,682,113 A | 10/1997 | Park et al. | |
| 5,818,263 A * | 10/1998 | Ashuri | 326/93 |
| 5,825,225 A * | 10/1998 | Sugisawa et al. | 327/208 |
| 5,923,188 A * | 7/1999 | Kametani et al. | 326/93 |
| 6,016,070 A | 1/2000 | Uehara | |
| 6,111,447 A | 8/2000 | Ternullo, Jr. | |
| 6,380,764 B1 * | 4/2002 | Katoh et al. | 326/93 |

FOREIGN PATENT DOCUMENTS

| | | |
|---|---|---|
| JP | 7015319 | 1/1995 |
| JP | 7221631 | 8/1995 |

OTHER PUBLICATIONS

Athas. Low-Power Digital Systems Based on Adiabatic-Switching Principles. IEEE Transactions on Very Large Scale Integration (VLSI) Systems, vol. 2, No. 4, Dec. 1994. pp. 398-407.

* cited by examiner

HIGH PERFORMANCE CLOCK-POWERED LOGIC

This application is a continuation of U.S. application Ser. No. 10/031,672, (now U.S. Pat. No. 7,005,893, issued Feb. 28, 2006) entitled "High-Performance Clock-Powered Logic," accorded the filing date of Sep. 9, 2002, which is a United States National Phase Application of PCT Application Serial No. PCT/US00/19608, filed Jul. 18, 2000, entitled "High-Performance Clock-Powered Logic," which claims the benefit of the filing date of U.S. Provisional Application No. 60/144,520, entitled "High-Performance Clock-powered Logic," filed Jul. 19, 1999, and U.S. Provisional Application No. 60/174,509, entitled "A Low-Power SRAM With Resonantly Powered Data, Address, Word and Bit Lines," filed Jan. 5, 2000, the contents of all of which are incorporated herein by reference.

GOVERNMENT LICENSE RIGHTS

The invention was made with government support under Contract Nos. DAAL 01-95-K3528 and DABT63-96-C-0001 awarded by the Defense Advance Research Projects Agency (DARPA). The government has certain rights in the invention.

BACKGROUND OF INVENTION

1. Field of the Invention

This invention relates to digital systems and, more particularly, to digital systems that are driven by clock-powered logic, including adiabatic signals.

2. Description of Related Art

Digital systems include signal lines that carry digital signals, including data lines, address lines and control lines.

In many instances, these signal lines are much longer than the distances between the integrated circuitry components. Such long signal lines are commonly used to connect the various subsystems in an integrated circuit, as well as the pixels in an LCD display.

One of the primary problems with long signal lines is the substantial capacitance which they impose. As is well known, the presence of this substantial capacitance causes a corresponding substantial loss in energy while the signal lines are being driven between one logic state and another, such as commonly occurs during the serial delivery of digital data over the signal lines.

One attempt to minimize these energy losses is to use what has become known as a "clocked buffer." In a typical digital system, the digital signal powers one end of a signal line by controlling switches that switch the end of the signal line between the supply voltage (typically logic "1") and ground (typically logic "0"). With a clocked buffer, on the other hand, the digital signal is instead used to control the delivery of a clock signal into the input of the signal line.

If this clock signal rises and falls slowly, energy will be saved, particularly when energy stored in the capacitance of the signal lines is returned to a temporary storage device for re-use during the next clock cycle. The use of a slowly rising and falling signal to power a digital system has become known as adiabatic charging and discharging. Examples of such signals are described in U.S. Pat. Nos. 5,559,478 and 5,473,526.

Unfortunately, the use of clocked buffers to power logic has, in the past, had some drawbacks.

First, the circuitry usually requires the voltage of the clock signal to exceed the supply voltage, i.e., for the clock signal to run "hot." This may stress certain digital devices by forcing them to run at voltage levels beyond the levels for which they were designed. The excessive voltages, moreover, tend to offset the energy savings realized from the clock-powered approach, since energy loss increases as the square of the voltage increase.

A second problem with existing clock-powered logic is that it often reduces the speed at which the logic circuitry can be clocked. Generally, the existing clock-powered logic systems require the logic circuitry to process the incoming digital signals and to generate an appropriate output signal within no more than one-half of the period of the clock signal and, in many cases, on even a faster basis. This increases the required speed of the logic circuitry or, in the alternative, reduces the maximum speed of the clock signal.

Solutions to the problems of excessive clock signal voltage and insufficient processing time, moreover, have usually worked against one another. One way to reduce the adverse consequences of "hot clocks" is to reduce the voltage of these clocks. Reducing clock signal voltage, however, usually reduces processing speed, thereby requiring clock signal speed to be even further reduced. Conversely, the speed at which the logic processes its signals can usually be increased by increasing the voltage of the clock signal. Unfortunately, this increases concerns over device stress and energy dissipation.

In short, there continues to be a need in the art for clock-powered logic that maximizes the conservation of energy without stressing devices, nor slowing system performance.

SUMMARY OF INVENTION

One object of the invention is to obviate these as well as other problems in the prior art.

Another object of the invention is to reduce energy consumption in digital systems.

A still further object of the invention is to increase the speed at which digital systems can operate.

A still further object of the invention is to reduce stress on digital circuitry components.

A still further object of the invention is to provide more time for digital logic circuitry to process signals, without slowing clock signal speed.

A still further object of the invention is to reduce the voltage of clock-powered logic.

These, as well as still further features, objects and benefits of the invention, are achieved through the use of various circuitry components, configurations and processing methods.

In one embodiment of the invention, a signal level booster has an input configured to be in communication with a signal that is reflective of the input digital signal. The booster also has an output that is reflective of the input to the signal level booster, but of greater magnitude.

A first latch has an input in communication with the output of the signal level booster. It is configured to be toggled by the output of the signal level booster and by a first clock signal. The first latch also has an output.

Digital logic has an input in communication with a signal that is reflective of the output of the first latch. The digital logic also has an output.

A second latch has an input in communication with the output of the digital logic. It is configured to be toggled by the output of the digital logic and by the first clock signal. The second latch has an output configured to deliver the output digital signal.

In one embodiment, a jam latch functions as the signal level booster and as the first latch. The second latch may also include an n-latch.

In one embodiment, the input digital signal and the output digital signal are each a single signal. In another embodiment, they are a complementary pair of signals.

In a still further embodiment, a clocked buffer is configured to be powered by a second clock signal that is complementary to and substantially substantially non-overlapping with the first clock signal. The clocked buffer has an input configured to be in communication with the input digital signal. It also has an output in communication with the signal level booster.

Preferably, the second clock signal is an adiabatic signal. The adiabatic signal may include blips, a staircase signal or a ramp signal.

In a still further embodiment, a third latch is provided having an input in communication with the output of the first latch. The third latch is configured to be toggled by the output of the first latch and by the second clock signal. The third latch has an output in communication with the input to the digital logic. The third latch may include an n-latch.

The invention also includes methods of signal processing, including methods implemented by the circuitry discussed above.

The invention also includes other structures, methods, features and benefits, as will now become clear from a review of the following detailed description of the preferred embodiments and the attached drawings and claims.

DETAILED DESCRIPTION OF PREFERRED EMBODIMENTS

Figure 1:
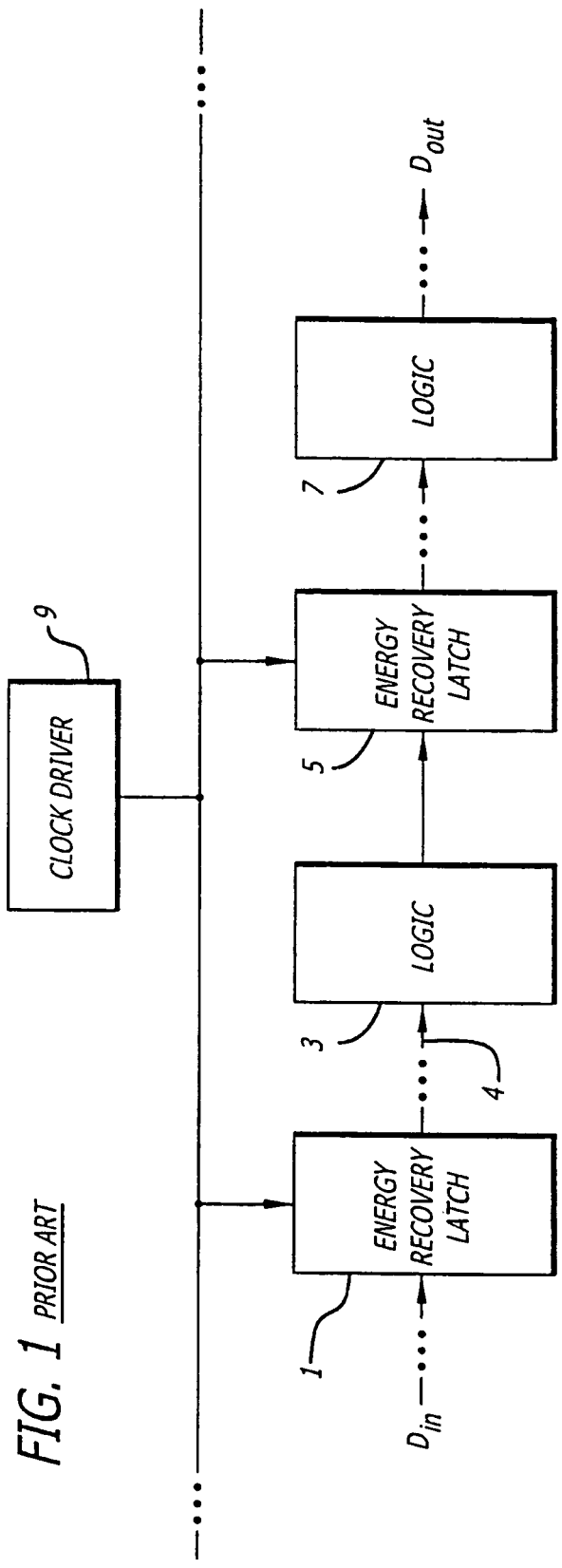
FIG. 1 is a block diagram of the architecture of a typical prior art clock-powered logic system.

FIG. 1 is a block diagram of the architecture of a typical prior art clock-powered logic system.

As shown in FIG. 1, the digital signal to be processed, $D_{in}$ in this example, is delivered to an energy recovery latch 1. The output of the energy recovery latch 1 is delivered to digital logic 3.

Digital logic 3 represents the digital logic that processes the signal received from the energy recovery latch 1, typically over a long signal line, such as signal line 4.

The output of the digital logic 3 is delivered to a second energy recovery latch 5. The output of the second energy recovery latch 5 is delivered to a second set of digital logic 7. This architecture repeats until the digital signal, $D_{in}$, is processed by all of the needed digital logic, leading to the generation of the output digital signal, $D_{out}$ in this example. The energy recovery latches, including latches 1 and 5, operate under the control of a clock driver 9.

Figure 2:
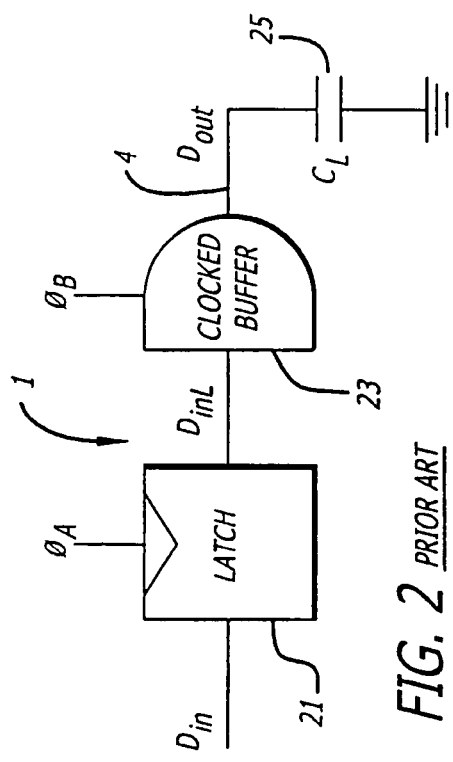
FIG. 2 is a block diagram of the prior art energy recovery latch shown in FIG. 1.

FIG. 2 is a block diagram of the prior art energy recovery latch 1 shown in FIG. 1. As shown in FIG. 2, the prior art energy recovery latch 1 includes a latch 21 and a clocked buffer 23. A capacitor 25 is included to illustrate the capacitance that the signal line 4 imposes.

Figure 3:
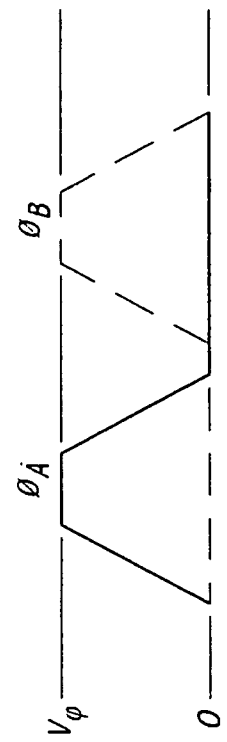
FIG. 3. is a graph of the prior art complementary and substantially substantially non-overlapping clock signals generated by the clock driver shown in FIG. 1.

FIG. 3 is a graph of the complementary and substantially substantially non-overlapping clock signals $\phi_A$ and $\phi_D$ generated by the prior art clock driver 9 shown in FIG. 1, the partial routing of which are shown in FIG. 2. The phrase "substantially substantially non-overlapping" is used to indicate that a small degree of overlap is permissible.

Figure 4:
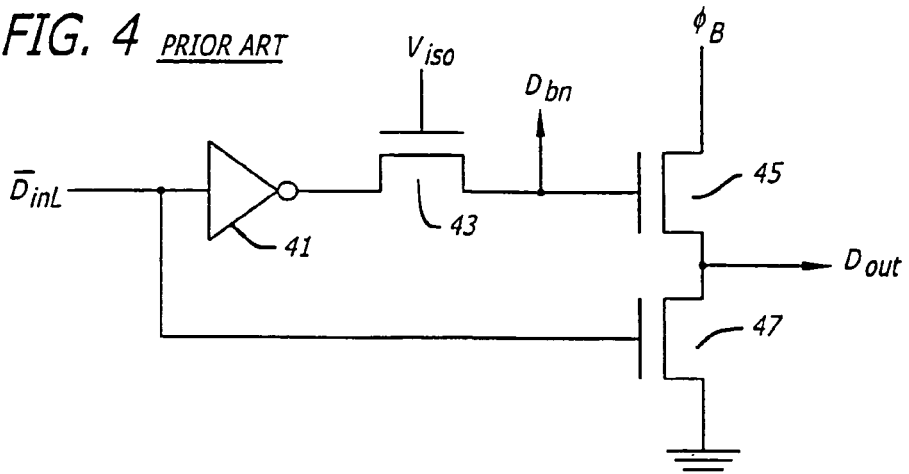
FIG. 4 is a typical prior art circuit for the prior art clocked buffer shown in FIG. 2.

FIG. 4 is a typical prior art circuit of the prior art clocked buffer 23 shown in FIG. 2. As shown in FIG. 4, the latched data, illustrated in FIG. 4 as $\overline{D_{inL}}$, is delivered to an inverter 41 and then to an electronic switch 43. $V_{iso}$ represents a reference voltage which, as will soon be seen, is quite high.

In operation, $D_{out}$ reflects the complementary clock signal phase $\phi_B$ when is low. This occurs through the operation of electronic switch 43, as well as electronic switches 45 and 47. In essence, the clock signal $\phi_B$ becomes buffered and metered by the data signal.

Figure 5:
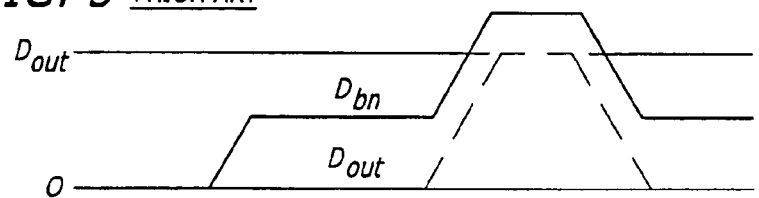
FIG. 5 is a graph of two of the signals that are typically generated by the prior art circuit shown in FIG. 4.

FIG. 5 is a graph of two of the signals that are typically generated by the prior art circuit shown in FIG. 4, namely $D_{out}$ and $D_{bn}$. As seen in FIG. 5, $D_{bn}$ must rise above the level of $D_{out}$ during the cycle. Because $D_{out}$ is typically at the supply level, this usually means that $D_{bn}$ is above the supply level and, as a consequence, that $\phi_B$ must be above the supply level.

This excessive voltage in $\phi_B$ is known as a "hot clock" and, as explained above, is undesirable. It potentially places stress on the components in the system and increases energy dissipation. Even greater stress is placed on the devices connected to $D_{bn}$.

Figure 6:
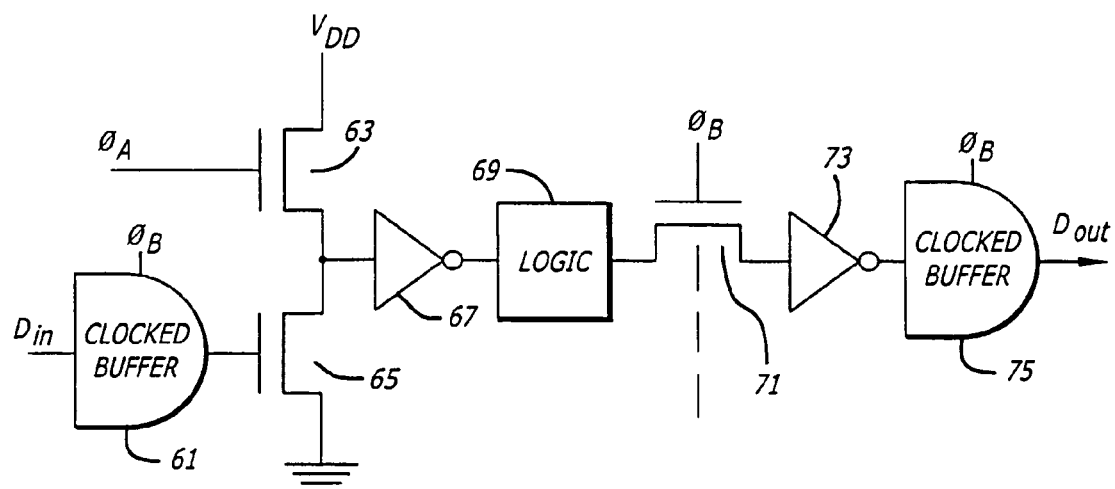
FIG. 6 is a diagram of some of the typical prior art components relating to the prior art digital logic shown in FIG. 1.

FIG. 6 is a diagram of some of the typical prior art components relating to the prior art digital logic shown in FIG. 1. Clocked buffer 61 is just one of many clocked buffers that are used in the system, such as the one illustrated in FIG. 2. Electronic switches 63 and 65 form a latch that is controlled by the output of the clocked buffer 61 and the clocked signal $\phi_A$. The output of this latch is inverted by an inverter 67 and delivered to digital logic circuitry 69. In order to preserve the state of the digital logic circuitry 69 after processing input data, the output of the digital logic circuitry 69 is delivered to an electronic switch 71 and to an inverting buffer 73. The output of the inverting buffer 73 is then again delivered to a clocked buffer 75 to generate $D_{out}$.

In order to ensure the proper functioning of the inverting buffer 73, the input to the inverting buffer 73 must be at near-supply level during its logic "1" state. In turn, this requires the voltage of the clock signal $\phi_A$ to be above the supply level, just like with $\phi_B$. This again raises concerns over circuitry stress and increases energy dissipation.

As explained above, another problem with the clock-powered logic in the prior art is that the digital logic circuitry must operate very quickly. More specifically, the digital logic 69 must operate fast enough to generate an output by the time its input signal is removed. In the typical prior art circuit, the input signal to the digital logic 69 begins on the rising edge of clock signal $\phi_B$ and ends on the falling edge of clock signal $\phi_B$. In order to generate a stable output during this interim, the digital logic 69 must either be very fast or the clock signal $\phi_B$ must be very slow. Neither approach is desirable.

To maximize energy conservation, the clocks should rise and fall as slowly as possible. Signals with slow rising and falling edges have become known as adiabatic signals. Thus far, one form of slowly rising and falling edges has been shown in FIG. 3. Another form is a blip signal, as shown in FIG. 7(a). Another form is a staircase signal, as shown in FIG. 7(b). A still further form is a ramp signal, as shown in FIG. 7(c). A circuit for generating the blip signal shown in FIG. 7(a) is disclosed in U.S. Pat. No. 5,559,478. A circuit for generating the staircase signal shown in FIG. 7(b) is shown in U.S. Pat. No. 5,473,526. The content of both of these patents is incorporated herein by reference.

Figure 8:
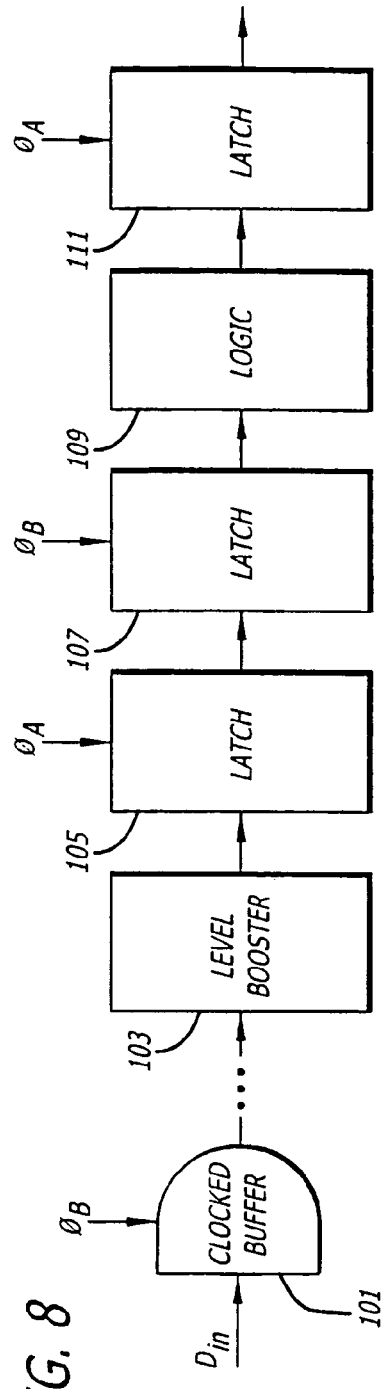
FIG. 8 is a block diagram of one embodiment of the invention.

FIG. 8 is a block diagram of one embodiment of the invention. As will soon be seen, FIG. 8 represents clock-powered logic that utilizes a clock signal that is below the supply voltage, without sacrificing speed. Further, the system shown in FIG. 8 allows the clock signal speed to be faster, without increasing the speed of the logic.

As shown in FIG. 8, a digital signal, such as $D_{in}$, is used to control a clocked buffer 101 that operates under the control of a clock signal $\phi_B$. The clocked buffer 101 is the same as the clocked buffers shown in the prior art, except that it produces a clocked signal of lower voltage and does not require a "hot clock."

A level booster 103 receives the clocked signal from the clocked buffer 101 and boosts its level. The output of the level booster 103 is delivered to a latch 105 that operates under the control of the clock signal $\phi_A$. The output of the latch 105 is delivered to a second latch 107 that operates under the control of the clock signal $\phi_B$. The output of the latch 107 is delivered to digital logic 109. Digital logic 109 is any form of digital logic, including data processing circuitry, memory, control circuitry, and addressing circuitry.

The output of the digital logic 109 is delivered to a third latch 111 that operates under the control of the clock signal $\phi_A$. The output of the latch 111 represents the final processed digital signal $D_{out}$.

The data signals, $D_{in}$ and $D_{out}$ are merely representative of the types of digital signals that the invention can process. The invention is equally useful in connection with all other types of digital signals, such as digital signals representing addresses or control.

Figure 7:
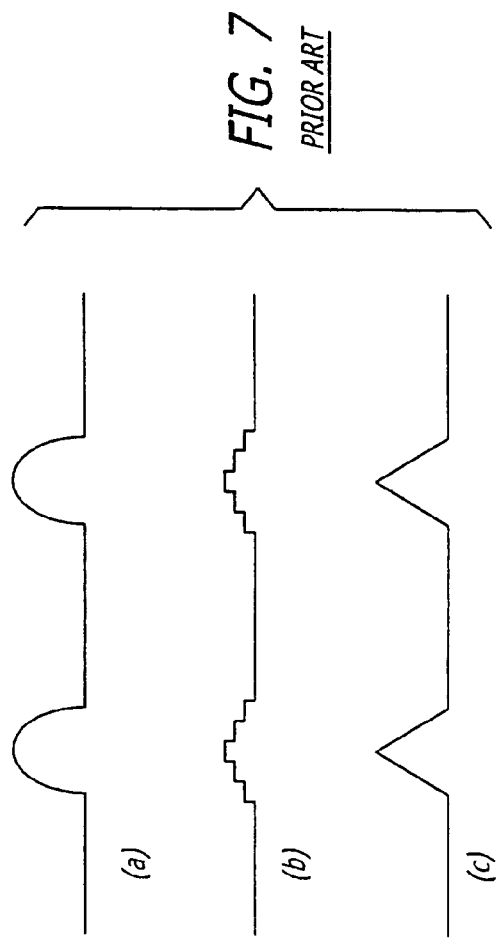
FIGS. 7 (*a*)-(*c*) are graphs of other typical prior art adiabatic signals that may be used in the prior art clock-powered logic shown in FIG. 1.

The clock signals $\phi_A$ and $\phi_B$ are preferably the same type of complementary and substantially non-overlapping clock signals that were discussed above in connection with the prior art, namely the trapezoid signals shown in FIG. 3, or the blips, staircase or ramp signals shown in FIG. 7. Other adiabatic wave shapes can also be used. Indeed, the invention is also applicable to fast-rising, non-adiabatic signals, although it is anticipated that there would be less energy recovery with such signals. Even overlapping clock signals could be used, although the circuitry would have to be different.

Although having illustrated only one segment of digital logic, digital logic 109, the clock-powered logic shown in FIG. 8 is often repeated, much like the architecture that is shown in FIG. 1. FIG. 8 is intended to merely illustrate the overall topology of a section of the typical clock-powered logic system that incorporates the invention.

Figure 9:
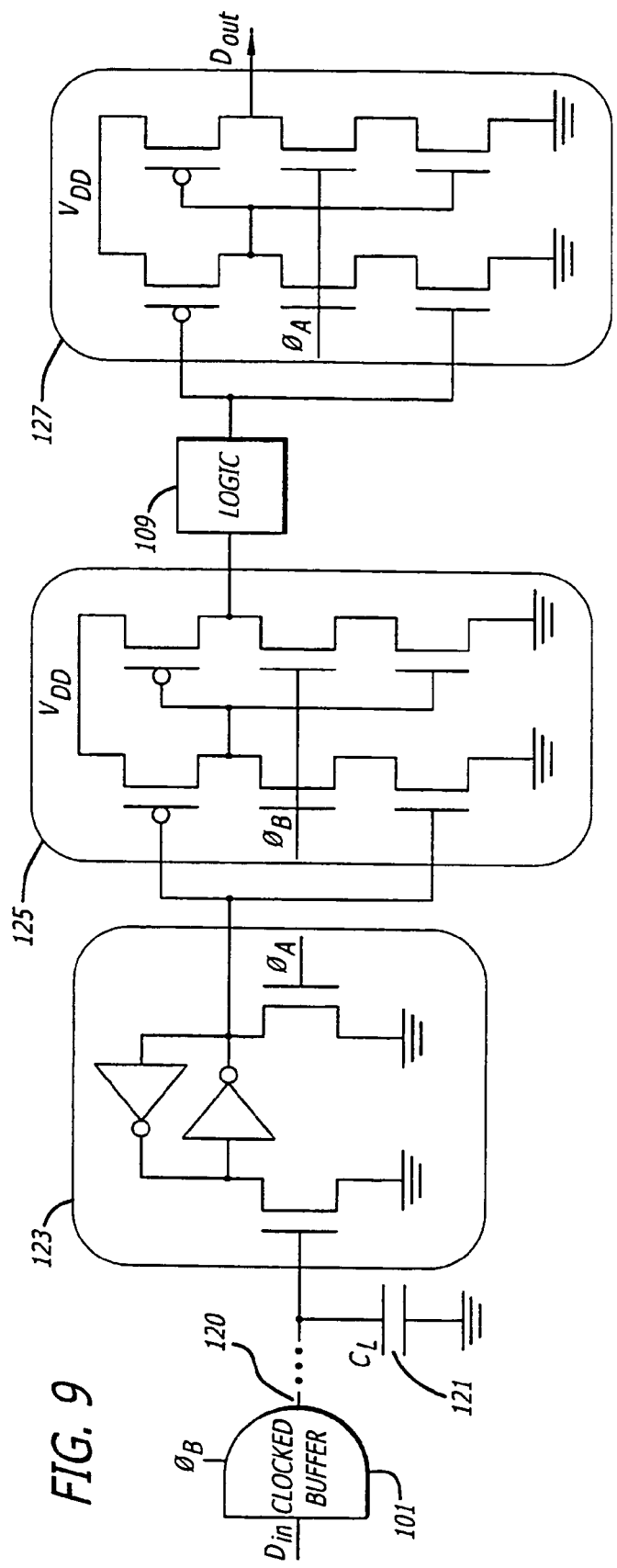
FIG. 9 is one embodiment of a circuit of the invention that is shown in FIG. 8.

FIG. 9 is a circuit of one embodiment of the invention shown in FIG. 8.

The clocked buffer 101 can be the same circuit as was discussed above in connection with the clocked buffer of the prior art, such as the circuitry shown in FIG. 4. As will soon be seen, however, the invention does not require a "hot clock." Thus, the magnitude of the voltage of $\phi_B$ (as well as $\phi_A$, as will be seen later) can be below the supply voltage. This is accomplished with an appropriate reduction in $V_{iso}$ (see FIG. 4), as should be readily apparent to the skilled artisan.

A capacitor 121 reflects the capacitance that is exhibited by the signal line 120 over which the clocked signal from the clocked buffer 101 is delivered. The signal line 120 is usually long with respect to the distances between the circuitry components in the digital logic 109; however, this is not a requirement of the invention.

The level booster 103 and the latch 105 in FIG. 8 are implemented in FIG. 9 by a single jam latch 123. As should be obvious to those skilled in the art, the jam latch 123 is set by a rising edge from the clocked buffer 101 and reset by a rising edge from the clock signal $\phi_A$. As is known, a jam latch is an example of a device that converts a pulse to a level and also boosts the level of the signal. Other devices that perform one or more of these functions could also be used, albeit with varying results.

The output of the jam latch 123 is then delivered to an n-latch 125 that implements the latch 107 shown in FIG. 8. The n-latch is set by a rising edge from the output of the jam latch 123 and reset by a rising edge from the clock signal $\phi_B$. As is known, an n-latch is an example of a device that can be clocked by a small-swing signal. Other devices that perform this function could be used instead.

The output of the n-latch 125 is then delivered to the digital logic 109, which is the same as the digital logic 109 shown in FIG. 8. The output of the digital logic 109 is then delivered to a second n-latch 127 that preserves the output of the digital logic 109 under the control of the clock signal $\phi_A$. The output of the n-latch 127 is then delivered as the output data, $D_{out}$.

The advantages of this configuration over the prior art configuration shown in FIG. 1 should now be apparent. First, the level boosting function of the jam latch 123 allows the system to function with a low clock signal voltage. Second, the use of two latches, the jam latch 123 and the n-latch 125, prolongs the period during which the clocked data signal is delivered to the digital logic 109 for almost a complete clock signal cycle, thereby giving the digital logic 109 far more time to develop the necessary output before the input signal is removed. Further, all of these functions are also achieved with a clock signal voltage that is below the supply voltage.

Figure 10:
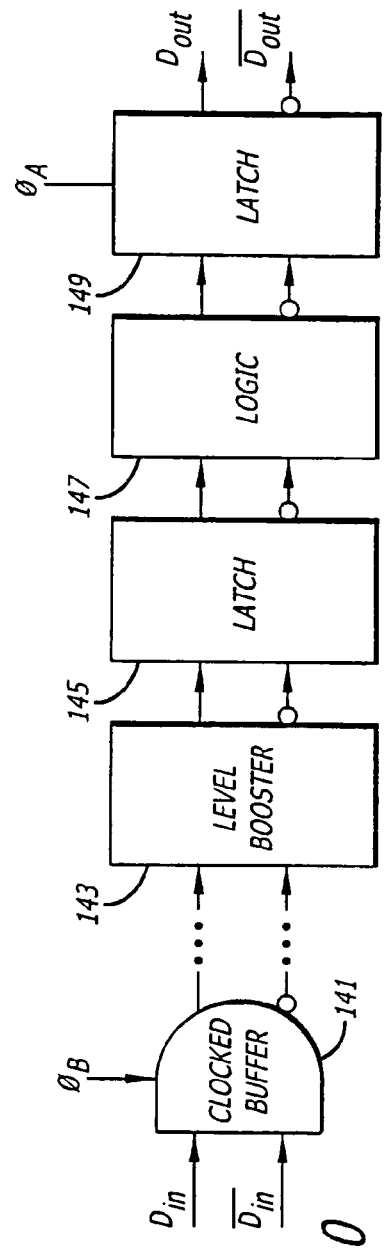
FIG. 10 is a block diagram of another embodiment of the invention using complementary input signals, but only a single latch between the clocked buffer and the digital logic.

FIG. 10 is a block diagram of another embodiment of the invention using complementary input signals, but only a single latch between the clocked buffer and the digital logic. As shown in FIG. 10, a complementary clocked buffer 141 receives complementary data signals and, under the control of clock signal $\phi_B$, delivers complementary clocked buffer outputs to a complementary level booster 143. In turn, the output of the complementary level booster 143 is delivered to a complementary latch 145. The output of the complementary latch 145 is delivered to complementary digital logic 147. The output of the complementary digital logic 147 is delivered to a complementary latch 149. The output of the complementary latch is a complementary set of $D_{out}$. The complementary latch 149 is operated under the control of clock signal $\phi_A$.

The use of these complementary signals enables the embodiment of FIG. 10 to essentially achieve all of the advantages and benefits of the embodiment of FIG. 8, without the second latch 107 that is shown in FIG. 8. Unlike the embodiment in FIG. 8, the first latch 145 in FIG. 10 is reset by the complementary clocked and boosted signal, as opposed to being reset by $\phi_A$, as is the first latch 105 in FIG. 8.

Figure 11:
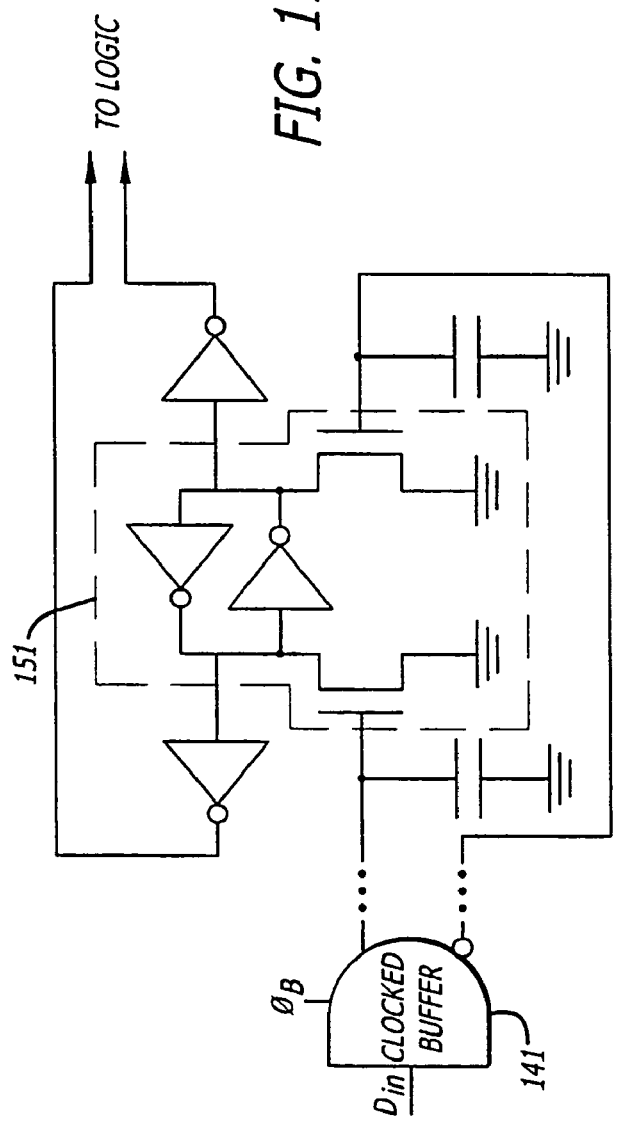
FIG. 11 is a circuit of one embodiment of the level booster and latch shown in FIG. 10.

FIG. 11 is a circuit of one embodiment of the level booster 143 and the latch 145 that is shown in FIG. 10. As can be seen in FIG. 11, the complementary output of the clocked buffer 141 is used to control a jam latch 151 that is included as a component. Because the jam latch 151 is no longer reset by the clock signal $\phi_A$, as it was in FIG. 9, the output of the latch intrinsically remains high throughout the clock signal period, thus giving the digital logic 147 more time for processing, without the addition of a second latch, such as the latch 107 shown in FIG. 8.

Figure 12:
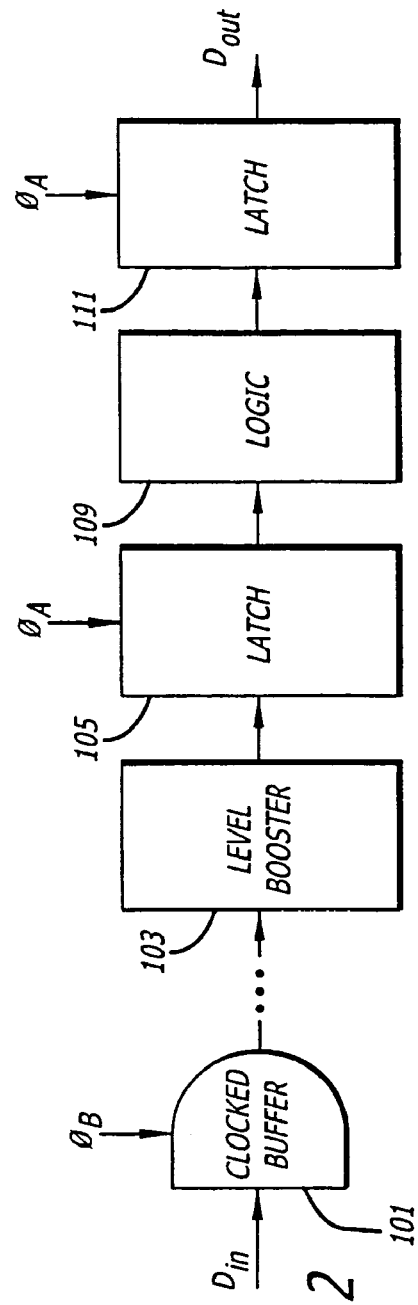
FIG. 12 is a block diagram of another embodiment of the invention that does not use two latches between the clocked buffer and the digital logic, nor complementary digital input signals.

FIG. 12 is a block diagram of a still further embodiment of the invention that does not use two latches between the clocked buffer and the digital logic, nor complementary data signals. This configuration is essentially the same as the one shown in FIG. 8, except that the second latch 107 is missing. With this configuration, the digital logic 109 is not given more time to process the input signal than it was given in the prior art circuit shown in FIG. 1. On the other hand, the system of FIG. 12 still eliminates the need for "hot clocks."

The embodiments of the invention that thus-far been described are for illustration purposes only. The invention is not limited to these embodiments. Rather, the invention encompasses a broad variety of other embodiments and signal processing approaches and is limited solely by the claims that now follow.

The invention claimed is:

1. A digital system comprising:
   a clocked buffer configured to provide an adiabatic clock signal into the input of a signal-carrying line that is buffered and metered by a data signal;
   a signal-carrying line having two ends, one of which is coupled to the adiabatic clock signal;
   a first latch having an input coupled to the other end of the signal line and an output;
   digital logic having an input coupled to the output of the first latch and an output; and
   a second latch separate from the first latch coupled to the output of the digital logic.

2. The digital system of claim 1 wherein:
   the digital logic is powered by a supply line; and
   the adiabatic clock signal has a magnitude lower than the magnitude of the supply line.

3. The digital system of claim 1 wherein the first latch is a jam latch.

4. The digital system of claim 1 wherein the second latch is an n-latch.

5. The digital system of claim 1 wherein the clocked buffer is a first clocked buffer and further comprising a second clocked buffer configured to provide an adiabatic clock signal that is complementary to and substantially non-overlapping with the first clock signal.

6. A digital system comprising:
   a clocked buffer configured to provide a clock signal having a magnitude lower than the magnitude of a supply line signal into the input of a signal-carrying line that is buffered and metered by a data signal;
   a signal-carrying line having two ends, one of which is coupled to the clock signal;
   a first latch having an input coupled to the other end of the signal line and an output;
   digital logic powered by the supply line and having an input coupled to the output of the first latch and an output; and
   a second latch separate from the first latch coupled to the output of the digital logic.

7. The digital system of claim 6 wherein the clock signal is adiabatic.

8. The digital system of claim 6 wherein the first latch is a jam latch.

9. The digital system of claim 6 wherein the second latch is an n-latch.

10. The digital system of claim 6 wherein the clocked buffer is a first clocked buffer and further comprising a second clocked buffer configured to provide an adiabatic clock signal that is complementary to and substantially non-overlapping with the first clock signal.

11. A digital logic system comprising a clocked buffer configured to provide an adiabatic clock signal having a magnitude lower than the magnitude of a supply line signal into the input of a signal-carrying line that is buffered and metered by a data signal and a digital logic circuit powered by the supply line and configure to perform a logic operation in synchronism with the adiabatic clock signal.

* * * * *